(12) United States Patent
Kong et al.

(10) Patent No.: US 12,451,892 B2
(45) Date of Patent: Oct. 21, 2025

(54) PHASE-LOCKED LOOP CIRCUIT AND SIGNAL PROCESSING DEVICE

(71) Applicant: SHENZHEN MICROBT ELECTRONICS TECHNOLOGY CO., LTD., Guangdong (CN)

(72) Inventors: Weixin Kong, Guangdong (CN); Zuoxing Yang, Guangdong (CN); Haifeng Guo, Guangdong (CN)

(73) Assignee: SHENZHEN MICROBT ELECTRONICS TECHNOLOGY CO., LTD., Guangdong (CN)

( * ) Notice: Subject to any disclaimer, the term of this patent is extended or adjusted under 35 U.S.C. 154(b) by 99 days.

(21) Appl. No.: 18/272,271

(22) PCT Filed: Jan. 7, 2022

(86) PCT No.: PCT/CN2022/070700
§ 371 (c)(1),
(2) Date: Jul. 13, 2023

(87) PCT Pub. No.: WO2023/005157
PCT Pub. Date: Feb. 2, 2023

(65) Prior Publication Data
US 2024/0313790 A1    Sep. 19, 2024

(30) Foreign Application Priority Data
Jul. 27, 2021  (CN) .......................... 202110848675.1

(51) Int. Cl.
*H03L 7/089*  (2006.01)
*H03L 7/093*  (2006.01)
*H03L 7/107*  (2006.01)

(52) U.S. Cl.
CPC .......... *H03L 7/0891* (2013.01); *H03L 7/0898* (2013.01); *H03L 7/093* (2013.01); *H03L 7/1072* (2013.01); *H03L 7/1075* (2013.01)

(58) Field of Classification Search
CPC ..... H03L 7/0891; H03L 7/0898; H03L 7/093; H03L 7/1072; H03L 7/1075
See application file for complete search history.

(56) References Cited

U.S. PATENT DOCUMENTS

| 7,649,408 B2 | 1/2010 | Liu et al. |
| 8,723,567 B1 * | 5/2014 | Dang ................. H03H 11/1269 327/558 |

(Continued)

FOREIGN PATENT DOCUMENTS

| CN | 1839548 A | 9/2006 |
| CN | 105075122 A | 11/2015 |

(Continued)

OTHER PUBLICATIONS

International Search Report and Written Opinion for PCT/CN2022/070700 mailed on Mar. 2, 2022 (5 pages including English Translation).

(Continued)

*Primary Examiner* — Patrick O Neill
(74) *Attorney, Agent, or Firm* — Merchant & Gould P.C.

(57) ABSTRACT

The present disclosure relates to a phase-locked loop circuit and a signal processing device. The phase-locked loop circuit includes: a charge pump configured with a charge pump current; and a loop filter connected to the charge pump and configured with a first resistance value, a first capacitance value, and a second capacitance value, wherein a zero frequency of the phase-locked loop circuit is configured to be determined by the first resistance value and the first capacitance value, and a pole frequency of the phase-locked loop circuit is configured to be determined by the first (Continued)

resistance value and the second capacitance value; wherein at least two of the charge pump current, the first resistance value, the first capacitance value, and the second capacitance value are adjustable, to change a loop bandwidth of the phase-locked loop circuit, to maintain a first ratio between the zero frequency and the loop bandwidth unchanged, and to maintain a second ratio between the pole frequency and the loop bandwidth unchanged.

17 Claims, 6 Drawing Sheets

(56) References Cited

U.S. PATENT DOCUMENTS

| | | | |
|---|---|---|---|
| 9,099,995 | B2 | 8/2015 | Hinrichs et al. |
| 2002/0167367 | A1 | 11/2002 | Ingino, Jr. |
| 2007/0090882 | A1 | 4/2007 | Guenais |
| 2009/0085621 | A1 | 4/2009 | Liu et al. |
| 2009/0174446 | A1* | 7/2009 | Park .................... H03L 7/1072 327/157 |
| 2010/0321119 | A1 | 12/2010 | Wu et al. |
| 2012/0319786 | A1* | 12/2012 | kumar .................... H03L 7/18 331/1 R |
| 2014/0266475 | A1 | 9/2014 | Hinrichs et al. |

FOREIGN PATENT DOCUMENTS

| | | |
|---|---|---|
| CN | 107634759 A | 1/2018 |
| CN | 108540129 A | 9/2018 |
| CN | 109889194 A | 6/2019 |
| CN | 113300705 A | 8/2021 |
| TW | 200917663 A | 4/2009 |

OTHER PUBLICATIONS

Written Opinion for PCT/CN2022/070700 mailed on Mar. 2, 2022 (4 pages).
First Chinese Office Action dated Sep. 1, 2021 for Chinese Application No. 202110848675.1 (13 pages including English Translation).
Supplemental Search for Chinese Application No. 202110848675.1 (1 page).
Notification to Grant Patent Rights for Invention (3 pages including English Translation).
TW Office Action for TW Application No. 111100717 (6 pages including English Translation).
TW Search Report for TW Application No. 111100717.
Notice of Allowance for TW Application No. 111100717 (3 pages including English Translation).
Office Action for corresponding Korean Application No. 10-2023-7025880 issued on Aug. 14, 2025 (21 pages including English Translation).
Jong-Kwan Woo et al., "A Fast-Locking CDR Circuit with an Autonomously Reconfigurable Charge Pump and Loop Filter", IEEE Asian Solid-State Circuits Conference, 2006, 411-414.
L. F. Rahman et al., "High Performance CMOS Charge Pumps for Phase-locked Loop", Transactions on Electrical and Electronic Materials, 2015, 16(5):241-249, DOI: http://dx.doi.org/10.4313/TEEM.2015.16.5.241.

* cited by examiner

PHASE-LOCKED LOOP CIRCUIT AND SIGNAL PROCESSING DEVICE

CROSS-REFERENCE TO RELATED APPLICATIONS

This application is a National Stage Application of International Application No. PCT/CN2022/070700, filed 7 Jan. 2022, which claims benefit of Serial No. 202110848675.1, filed 27 Jul. 2021 in China, and which applications are incorporated herein by reference. To the extent appropriate, a claim of priority is made to each of the above disclosed applications.

TECHNICAL FIELD

The present disclosure relates to the technical field of electronic circuits, and in particular, to a phase-locked loop circuit and a signal processing device.

BACKGROUND

A phase-locked loop circuit is a feedback control circuit which can control the frequency and the phase of the oscillation signal inside the loop with the reference signal input outside, to achieve the automatic tracking of the output frequency to the input frequency. A plurality of signal processing devices such as a mobile communication base station and a frequency hopping communication system have the strict requirement for the locking time of the phase-locked loop circuit. Since the locking time of the phase-locked loop circuit is directly related to the loop bandwidth thereof, the locking time can be reduced by increasing the loop bandwidth, thereby speeding up the frequency locking. However, the change in the loop bandwidth may lead to the change in other parameter in the phase-locked loop circuit, which leads to the deterioration of the performance.

SUMMARY

The present disclosure is intended to provide a phase-locked loop circuit and a signal processing device.

According to a first aspect of the present disclosure, the phase-locked loop circuit is provided, including: a charge pump configured with a charge pump current; and a loop filter connected to the charge pump and configured with a first resistance value, a first capacitance value, and a second capacitance value, wherein a zero frequency of the phase-locked loop circuit is configured to be determined by the first resistance value and the first capacitance value, and a pole frequency of the phase-locked loop circuit is configured to be determined by the first resistance value and the second capacitance value; wherein at least two of the charge pump current, the first resistance value, the first capacitance value, and the second capacitance value are adjustable, to change a loop bandwidth of the phase-locked loop circuit, to maintain a first ratio between the zero frequency and the loop bandwidth unchanged, and to maintain a second ratio between the pole frequency and the loop bandwidth unchanged.

According to a second aspect of the present disclosure, the signal processing device is provided, including the phase-locked loop circuit as described above.

Through detailed description of exemplary embodiments of the present disclosure with reference to the following drawings, other features and advantages of the present disclosure will become clear.

BRIEF DESCRIPTION OF THE DRAWINGS

The drawings that constitute a part of the description describe embodiments of the present disclosure, and are used to explain the principle of the present disclosure together with the description.

The present disclosure can be understood more clearly according to the following detailed description with reference to the accompanying drawings.

Figure 1:
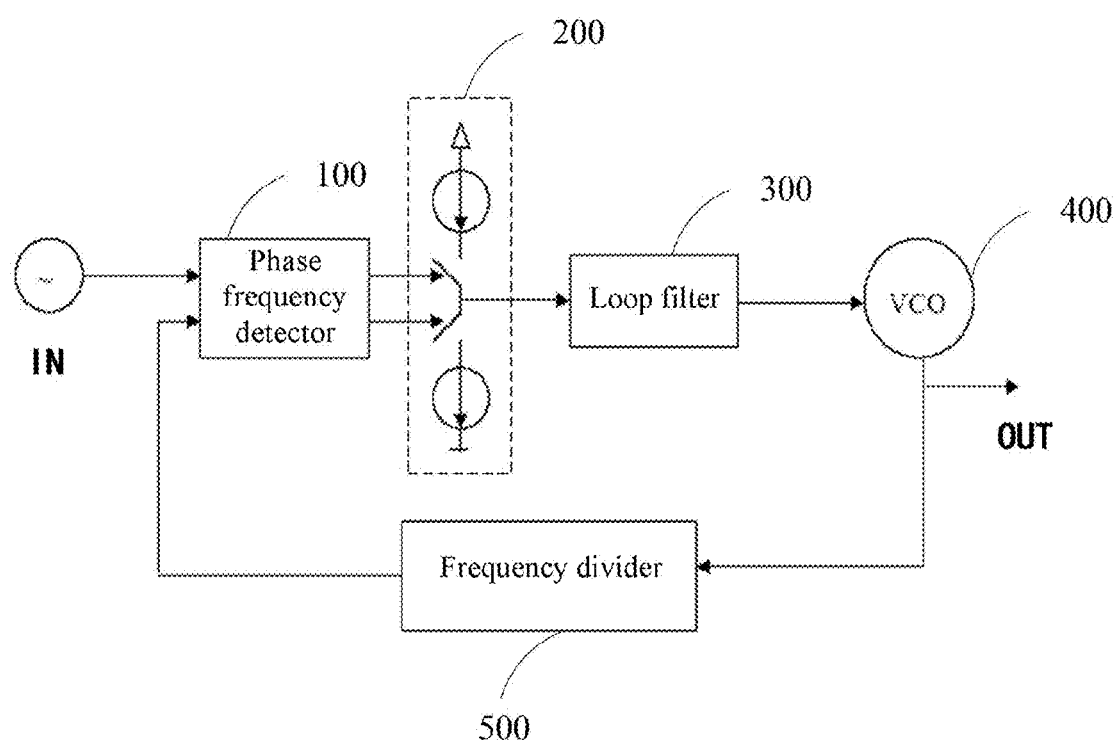
FIG. 1 shows a structural block diagram of a phase-locked loop circuit.

It is to be noted that in the implementations illustrated below, sometimes the same reference numeral is used in different drawings to represent the same part or a part with the same function, and repeated illustration thereof is omitted. In the description, similar numbers and letters are used to represent similar items. Therefore, once an item is defined in a drawing, the item in subsequent drawings is not further discussed.

For ease of understanding, the locations, sizes, ranges, and the like of various structures shown in the drawings sometimes do not represent the actual locations, sizes, ranges, and the like. Therefore, the disclosed invention is not limited to the locations, the sizes, the ranges, and the like disclosed in the drawings. Moreover, the drawings are not necessarily drawn to scale, and some features may be exaggerated to show the details of specific components.

DETAILED DESCRIPTION

Various exemplary embodiments of the present disclosure will be described in detail with reference to the drawings now. It is to be noted that unless otherwise specified in detail, the relative deployment, the numerical expression, and values of the components and steps stated in these embodiments do not limit the scope of the present disclosure.

In fact, the following description of at least one exemplary embodiment is merely illustrative, and does not put any limitation on the present disclosure and the application or use thereof. That is, circuits and methods in the present in the present disclosure are shown in an exemplary manner to describe different embodiments of the circuits or the methods in the present disclosure, and to not intend to impose limitations. One skilled in the art may understand that the circuits and the methods only illustrate the exemplary manner of implementing the present disclosure, rather than exhaustive manners.

Technologies, methods, and devices known to a person of ordinary skill in the related art may not be discussed in detail, but in proper circumstances, the technologies, methods, and devices shall be regarded as a part of the description.

As shown in FIG. 1, a phase-locked loop circuit can include a phase frequency detector 100, a charge pump 200, a loop filter 300, a voltage controlled oscillator (VCO) 400, and a frequency divider 500 connected in sequence, and the output of the frequency divider 500 is connected to the input of the phase frequency detector 100, to form the feedback loop. The phase frequency detector 100 can receive the input signal (IN) with the reference frequency, and the voltage controlled oscillator 400 can output the output signal (OUT) with the desired frequency.

Figure 2:
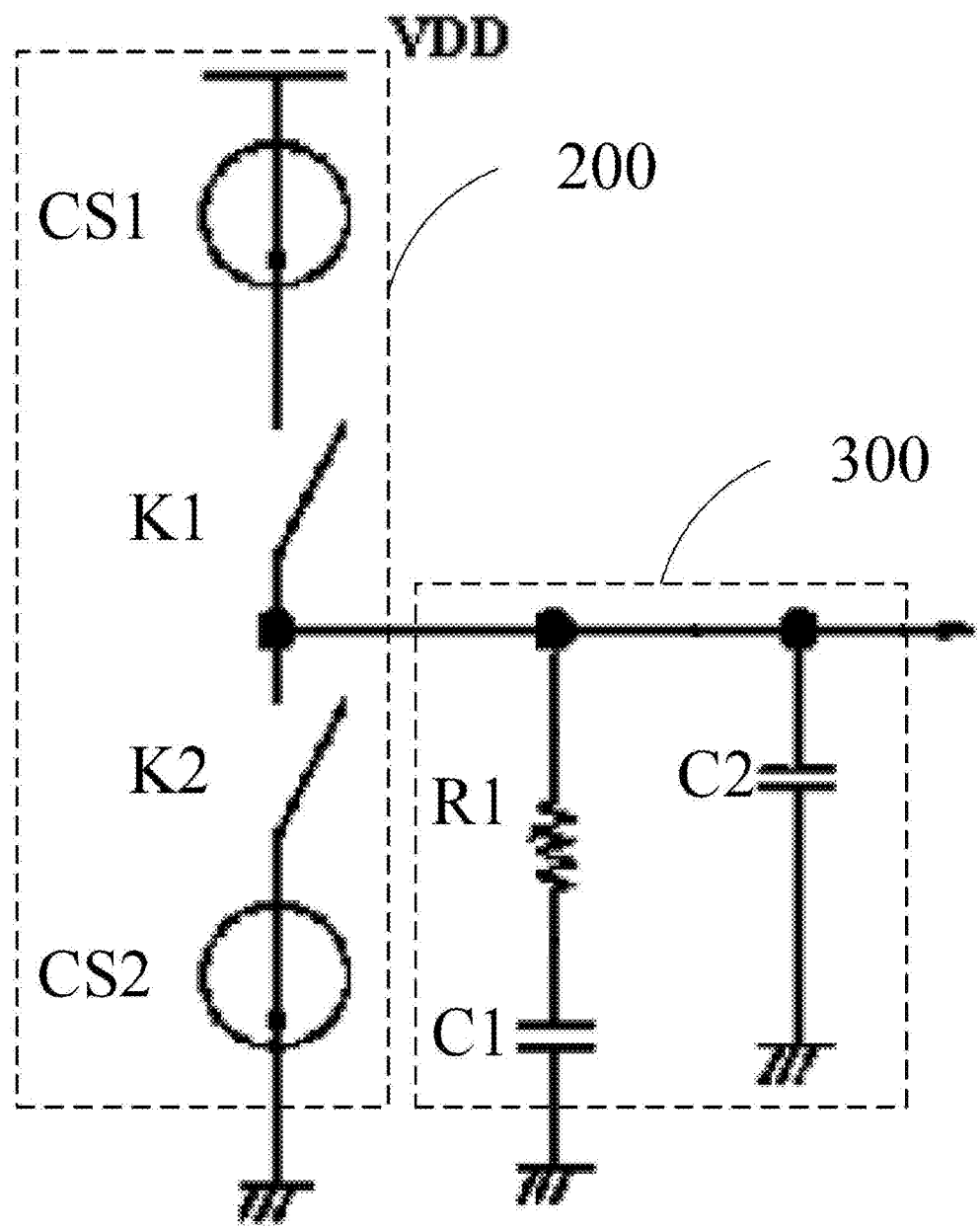
FIG. 2 shows a schematic circuit diagram of a charge pump and a loop filter in a phase-locked loop circuit.

FIG. 2 shows a schematic circuit diagram of a charge pump 200 and a loop filter 300 in a phase-locked loop circuit. The charge pump 200 can include a current source CS1 (such as the charging current source) connected to the output node via the switch K1 and another current source CS2 (such as the discharging current source) connected to the output node via the switch K2. The signal from the phase frequency detector 100 of the phase-locked loop circuit can control on and off of the switches K1 and K2, thereby controlling the charge pump current Icp output by the charge pump 200 to be the current substantially from the current source CS1 or from the current source CS2.

The loop filter 300 can include the resistor with the first resistance value R1 and two capacitors with the first and second capacitance values C1 and C2 respectively. The filtering parameter of the loop filter 300 can be adjusted by changing at least one of R1, C1, and C2.

In the phase-locked loop circuit including the charge pump 200 and the loop filter 300 in FIG. 2, the loop bandwidth can be expressed as $$BW = \frac{IcpGR1}{2\pi N},$$

wherein G is the gain coefficient of the VCO 400, and N is the frequency dividing ratio of the frequency divider. The zero frequency of the phase-locked loop circuit can be expressed as $$fz1 = \frac{1}{2\pi R1C1},$$

and the pole frequency of the phase-locked loop circuit can be expressed as $$fz2 = \frac{1}{2\pi R1C2}.$$

As mentioned above, a plurality of applications have strict requirement for the locking time of the phase-locked loop circuit. In order to speed up the locking of the phase-locked loop circuit, the loop bandwidth can be increased. However, the loop bandwidth can simultaneously affect other performance of the phase-locked loop circuit, such as the noise performance of the phase-locked loop circuit. Specifically, the relative narrow loop bandwidth is usually required to make the phase noise at a specific frequency offset to be satisfactory. In order to balance the locking time and the noise performance, the relative large loop bandwidth can be employed during locking of the phase-locked loop circuit, and the relative small loop bandwidth can be employed after the phase-locked loop circuit has been locked.

However, using the changeable loop bandwidth may also bring some problems, for example, the problem of how to ensure the stability of the loop. Specifically, the stability of the loop is related to the positions of the pole frequency and the zero frequency of the phase-locked loop circuit. In order to ensure the sufficient phase margin, the zero frequency of the phase-locked loop circuit is usually set at the position which is 3~4 times lower than the loop bandwidth, and the pole frequency of the phase-locked loop circuit is set at the position which is 3~4 times higher than the loop bandwidth. However, if the bandwidth is switched directly, usually the relationship between the zero frequency and the loop bandwidth, and the relationship between the pole frequency and the loop bandwidth are changed, and therefore the phase margin is hard to be ensured.

In order to resolve the above problem, the present disclosure provides a phase-locked loop circuit. As shown in FIG. 1, the phase-locked loop circuit can include the charge pump 200 and the loop filter 300 connected to the charge pump 200. The charge pump 200 can be configured with the charge pump current Icp, and the loop filter 300 can be configured with the first resistance value R1, the first capacitance value C1 and the second capacitance value C2. Also, at least two of the charge pump current Icp, the first resistance value R1, the first capacitance value C1, and the second capacitance value C2 are adjustable, to change the loop bandwidth of the phase-locked loop circuit, to maintain the first ratio between the zero frequency and the loop bandwidth unchanged, and to maintain the second ratio between the pole frequency and the loop bandwidth unchanged.

Considering that the gain G of the voltage controlled oscillator 400 and the frequency dividing ratio N of the frequency divider 500 in the phase-locked loop circuit are usually unchanged, adjustments of the two quantities are left aside below. Certainly, if possible, the gain G of the voltage controlled oscillator 400 and the frequency dividing ratio N of the frequency divider 500 can be changed to control the parameters of the loop filter such as the loop bandwidth, the zero frequency, the pole frequency and the like, which is not limited herein.

It can be learned from $$BW = \frac{IcpGR1}{2\pi N}$$

that the loop bandwidth BW can be switched by adjusting the charge pump current Icp and/or the first resistance value R1 in the phase-locked loop circuit, so as to satisfy the requirements for the locking time and the noise performance. Moreover, the first ratio between the zero frequency and the loop bandwidth in the phase-locked loop circuit can be expressed as $$\frac{fz1}{BW} = \frac{N}{G} \frac{1}{IcpR1^2C1}.$$

That is, when $IcpR1^2C1$ is maintained unchanged, the first ratio between the zero frequency and the loop bandwidth can be maintained unchanged. Similarly, the second ratio between the pole frequency and the loop bandwidth can be expressed as $$\frac{fz2}{BW} = \frac{N}{G} \frac{1}{IcpR1^2C2}.$$

That is, when $IcpR1^2C2$ is maintained unchanged, the second ratio between the pole frequency and the loop bandwidth can also be maintained unchanged. When the first ratio and the second ratio are both maintained unchanged, the phase margin in the phase-locked loop circuit can be well maintained.

Specifically, in some embodiments, the loop bandwidth can be changed by adjusting the charge pump current Icp and the first resistance value R1. When the adjusted charge pump current is K times as much as the unadjusted charge pump current, and the adjusted first resistance value is adjusted to be $1/\sqrt{K}$ times as much as the original first resistance value, the loop bandwidth is $\sqrt{K}$ times as much as the original loop bandwidth. Moreover, the first capacitance value C1 and the second capacitance value C2 can be maintained unchanged, so as to maintain the first ratio and the second ratio unchanged, that is, to maintain the phase margin of the phase-locked loop circuit unchanged. Here, K can be a non-zero number. In particular, in the case that the loop bandwidth is increased to speed up the locking, K may satisfy K>1.

In some other embodiments, the loop bandwidth can be changed by adjusting only the charge pump current Icp, while maintaining the first resistance value R1 unchanged. When the adjusted charge pump current is K times as much as the unadjusted charge pump current, the first capacitance value can be adjusted to be 1/K times as much as the original first capacitance value, and the second capacitance value can be adjusted to be 1/K times as much as the original second capacitance value, so as to maintain the first ratio and the second ratio unchanged to ensure the phase margin.

In still some other embodiments, the loop bandwidth can be changed by adjusting only the first resistance value R1, while maintaining the charge pump current Icp unchanged. For example, when the adjusted first resistance value is $1/\sqrt{K}$ times as much as the unadjusted first resistance value, the loop bandwidth is changed to be $1/\sqrt{K}$ times as much as the original loop bandwidth. At this time, in order to maintain the phase margin unchanged, the adjusted first capacitance value can be K times as much as the unadjusted first capacitance value, and the adjusted second capacitance value can be K times as much as the unadjusted second capacitance value.

Certainly, in some other embodiments, at least two of the charge pump current Icp, the first resistance value R1, the first capacitance value C1 and the second capacitance value C2 can also be adjusted in other ways, so as to achieve the change of the loop bandwidth while maintaining the phase margin of the phase-locked loop circuit unchanged, which is not described redundantly herein.

In some embodiments, the charge pump current Icp, the first resistance value R1, the first capacitance value C1 or the second capacitance value C2 can be continuously adjusted within a specific range, so as to obtain the desired value. In some other embodiments, the charge pump current Icp, the first resistance value R1, the first capacitance value C1 or the second capacitance value C2 can be adjusted to several discrete values, so as to achieve switching between the desired loop bandwidths and maintaining the phase margin unchanged. Setting several discrete values matched to each other for at least two physical quantities of the charge pump current Icp, the first resistance value R1, the first capacitance value C1 and the second capacitance value C2 can help simplify the circuit structure and achieve more accurate and fast switching compared to the continuous adjustable setting. The structure of such circuit will be described in detail below.

Figure 3:
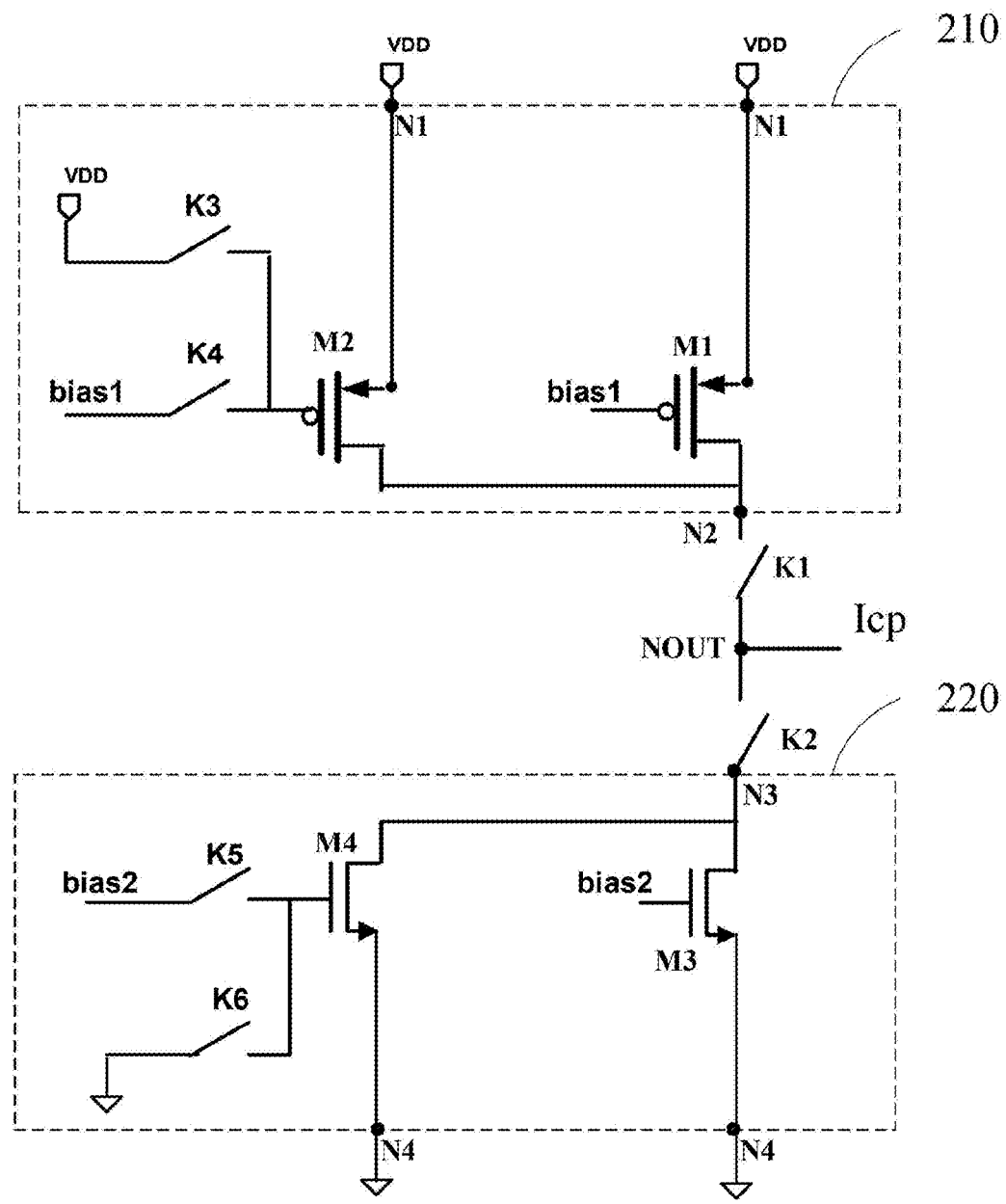
FIG. 3 shows a schematic circuit diagram of a charge pump in a phase-locked loop circuit according to an exemplary embodiment of the present disclosure.

In an exemplary embodiment, as shown in FIG. 3, the charge pump 200 can include the first current source 210 and the second current source 220. The first current source 210 can be the charging current source and the second current source 220 can be the discharging current source (alternatively, the first current source 210 is the discharging current source and the second current source 220 is the charging current source). The first node N1 of the first current source 210 can be configured to be connected to the power supply potential VDD, and the second node N2 of the first current source 210 can be connected to the output node NOUT of the charge pump via the first switch K1. The charge pump current can include the first current of the first current source 210. Generally, when the first switch K1 is in the on state and the second switch K2 is in the off state, the charge pump current is the first current of the first current source 210. Accordingly, the first current of the first current source 210 can be adjustable, for example, continuously or discretely.

The third node N3 of the second current source 220 can be connected to the output node NOUT via the second switch K2, and the fourth node N4 of the second current source 220 can be connected to the reference potential (for example, the ground potential). The charge pump current can include the second current of the second current source 220. Generally, when the first switch K1 is in the off state and the second switch K2 is in the on state, the charge pump current is the second current of the second current source 220. Accordingly, the second current of the second current source 220 can be adjustable, for example, continuously or discretely.

Further, in the specific embodiment shown in FIG. 3, the first current source 210 can include the first transistor M1 and the second transistor M2. One channel terminal (the source terminal or the drain terminal) of the first transistor M1 can be connected to the first node N1, another channel terminal of the first transistor M1 can be connected to the second node N2, and the control terminal (the gate terminal) of the first transistor M1 can be connected to the first bias potential bias1. One channel terminal of the second transistor M2 can be connected to the first node N1, another channel terminal of the second transistor M2 can be connected to the second node N2, and the control terminal of the second transistor M2 can be connected to the power supply potential VDD via the third switch K3 and to the first bias potential bias1 via the fourth switch K4.

Similarly, the second current source 220 can include the third transistor M3 and the fourth transistor M4. One channel terminal of the third transistor M3 can be connected to the third node N3, another channel terminal of the third transistor M3 can be connected to the fourth node N4, and the control terminal of the third transistor M3 can be connected to the second bias potential bias2. One channel terminal of the fourth transistor M4 can be connected to the third node N3, another channel terminal of the fourth transistor M4 can be connected to the fourth node N4, and the control terminal of the fourth transistor M4 can be connected to the second bias potential bias2 via the fifth switch K5 and connected to the reference potential via the sixth switch K6.

Figure 4:
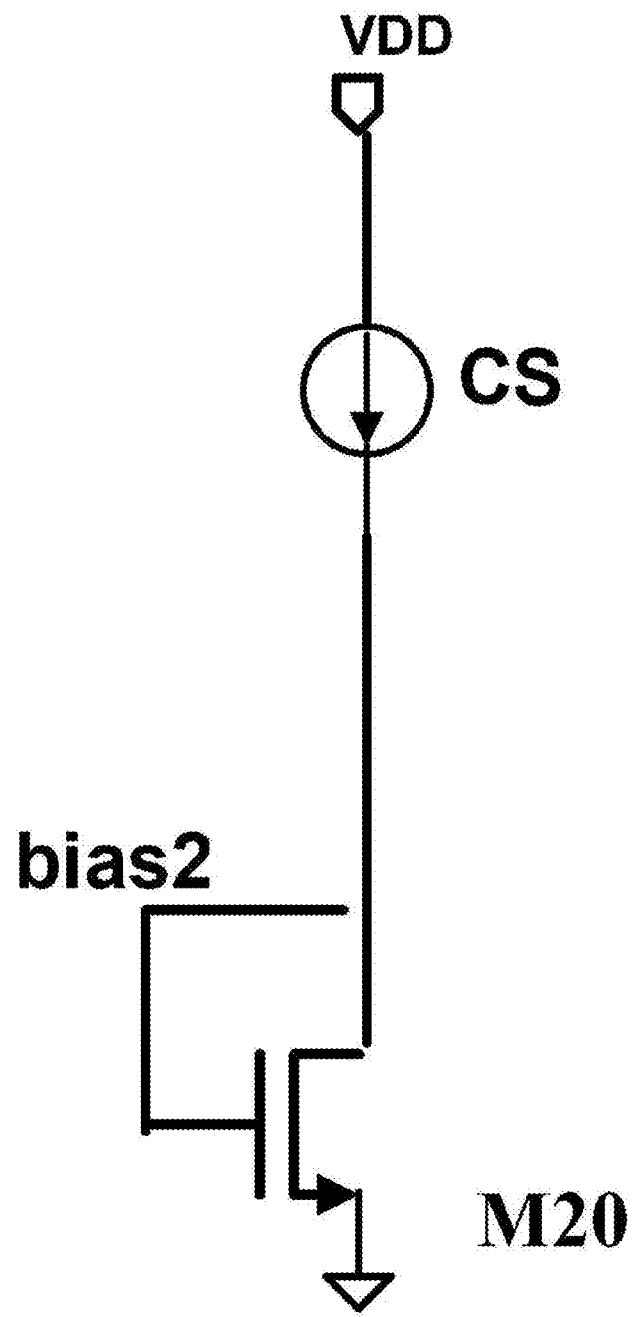
FIG. 4 shows a schematic diagram of a bias potential generation circuit according to an exemplary embodiment of the present disclosure.

The second bias potential bias2 can be generated by the bias potential generation circuit shown in FIG. 4 and be provided to the corresponding transistor in the charge pump, whereas the first bias potential bias1 can be generated naturally under the action of the components in the charge pump and the signals therein. In the circuit shown in FIG. 4, the transistor M20 can convert the current from the current source CS into corresponding potential, and the current from the current source CS can be provided as required.

In the embodiment shown in FIG. 3, on and off states of the third switch K3 can be opposite to that of the fourth switch K4, so as to control whether the second transistor M2 contributes to the first current of the first current source 210. On and off states of the fifth switch K5 can be opposite to that of the sixth switch K6, so as to control whether the fourth transistor M4 contributes to the second current of the second current source 220. Moreover, on and off states of the third switch K3 can be the same as that of the sixth switch K6. As such, on and off states of the fourth switch K4 are the same as that of the fifth switch K5, so as to ensure that the first current source 210 and the second current source 220 are always equilibrated. That is, the first current of the first current source 210 and the second current of the second current source 220 are substantially always equal.

In some embodiments, the third switch K3 and the sixth switch K6 can be the fifth transistor and the eighth transistor controlled by the first switch signal s1 respectively, and the fourth switch K4 and the fifth switch K5 can be the sixth transistor and the seventh transistor controlled by the second switch signal s2 respectively. Moreover, the first switch signal s1 and the second switch signal s2 can be opposite in phase. As such, a plurality of switches in the charge pump can be controlled using a signal and an inverted signal thereof conveniently.

In addition, the channel doping type of the first transistor M1 can be same as that of the second transistor M2, so as to cause the increase in the first current conveniently when the second transistor M2 is turned on. The channel doping type of the third transistor M3 can be same as that of the fourth transistor M4, so as to cause the increase in the second current conveniently when the fourth transistor M4 is turned on. In addition, the channel doping type of the first transistor M1 is opposite to that of the third transistor M3, accordingly, the channel doping type of the second transistor M2 is opposite to that of the fourth transistor M4, so as to form the first current source 210 and the second current source 220 respectively for charging and discharging. For example, in the specific embodiment shown in FIG. 3, the first transistor M1 and the second transistor M2 can be the p-type metal oxide semiconductor (PMOS) transistors, whereas the third transistor M3 and the fourth transistor M4 can be the n-type metal oxide semiconductor (NMOS) transistors. Certainly, in some other embodiments, the opposite doping type can be used and other relevant components or signal potentials in the charge pump are adjusted accordingly.

Taking the second current source 220 in FIG. 3 as an example, when the sixth switch K6 is controlled to be in the on state by the first switch signal s1, the fifth switch K5 is in the off state. At this time, only the third transistor M3 is in the on state and contributes to the charge pump current. However, when the sixth switch K6 is controlled to be in the off state by the first switch signal s1, the fifth switch K5 is in the on state. At this time, the third transistor M3 and the fourth transistor M4 are both in the on state and contribute to the charge pump current. As such, by controlling the states of the fifth switch K5 and the sixth switch K6, two different second currents can be output. Similarly, two different first currents can be output by controlling the states of the third switch K3 and the fourth switch K4.

In some embodiments, the channel widths of the first transistor M1 and the second transistor M2 can be determined according to at least change of the charge pump current before and after adjustment, so as to generate two currents with the desired value relationship. Similarly, the channel widths of the third transistor M3 and the fourth transistor M4 are determined according to at least change of the charge pump current before and after adjustment. For example, when the ratio between two different switchable currents is K, the current flowing through the second transistor M2 can be (K−1) times as much as that flowing through the first transistor M1 in the same condition. Accordingly, the channel width of the second transistor M2 can be (K−1) times as much as that of the first transistor M1. Certainly, in some other embodiments, two kinds of transistors output different currents can be formed by adjusting the channel length and the doping level of the transistor, which is not described redundantly herein.

When the loop bandwidth is switched in the phase-locked loop circuit, further it is necessary to solve the problem of how to keep the loop locked during the bandwidth switching. Specifically, if the loop bandwidth is switched when the phase-locked loop circuit is in the locked state, other deviations may be caused and thus the loop loses locking, and if the loop needs to be re-locked after the bandwidth becomes narrowed, a longer time is required. The main reason for the above deviation includes the phase error due to the mismatching between the charging current and the discharging current of the charge pump. This is because the bandwidth switching changes the current, which changes the situation of the current matching. The excessively large phase error can result in the re-locking of the phase-locked loop. The main reason for the current mismatching is that the modulation coefficients of the channel lengths of the NMOS and the PMOS in the conventional charge pump structure may be unequal, thus the first current I1 of the first current source and the second current I2 of the second current source may be unequal. In order to solve the above problem, the first mirror current source that forms the current mirror with the first current source and the second mirror current source that forms the current mirror with the second current source can be added to the charge pump, and the equilibrium between the first current I1 and the second current I2 can be maintained under the action of the operational amplifier follower.

Figure 5:
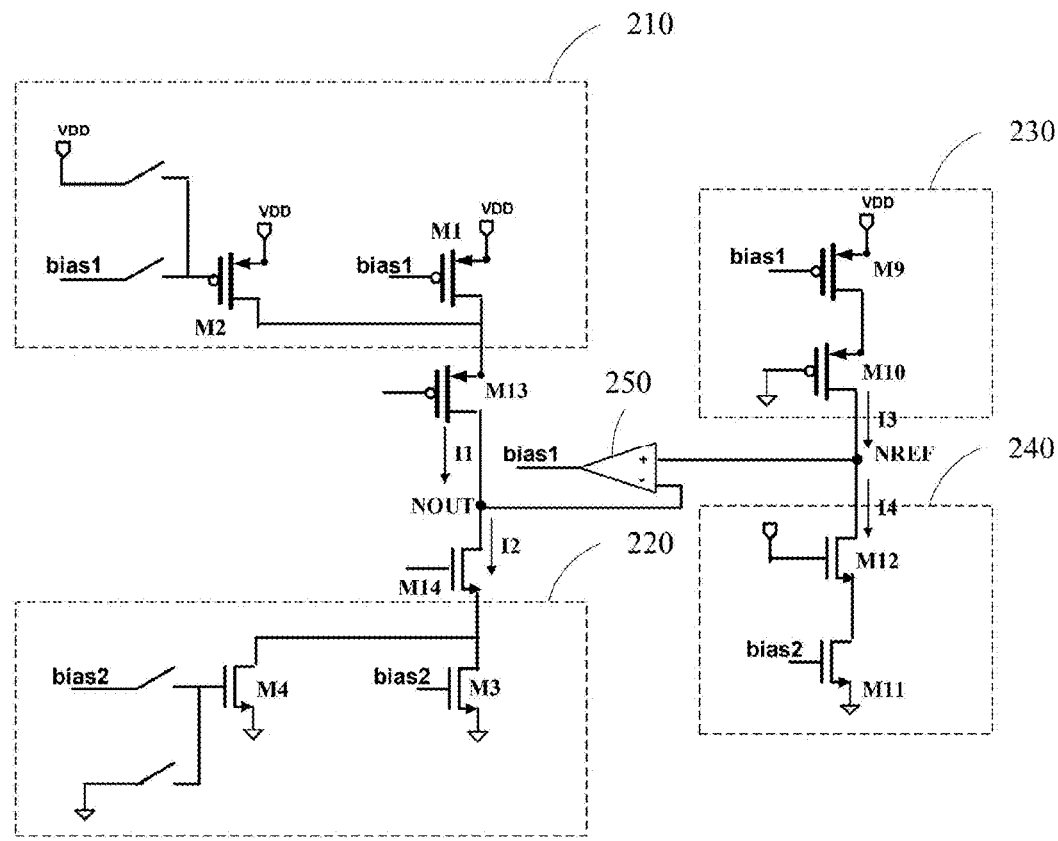
FIG. 5 shows a schematic circuit diagram of a charge pump in a phase-locked loop circuit according to another exemplary embodiment of the present disclosure.

Specifically, as shown in FIG. 5, the charge pump can further include the first mirror current source 230, the second mirror current source 240, and the operational amplifier follower 250. The first mirror current source 230 and the first current source 210 form the first current mirror together, the second mirror current source 240 and the second current source 220 form the second current mirror together, and the second mirror current source 230 and the first mirror current source 240 are connected to each other at the reference node NREF. The operational amplifier follower 250 can be connected between the reference node NREF and the output node NOUT to keep the potentials at NOUT and NREF equal.

In the specific embodiment shown in FIG. 5, the first mirror current source 230 can include the ninth transistor M9 and the tenth transistor M10. One channel terminal of the ninth transistor M9 can be connected to the power supply potential VDD, and the control terminal of the ninth transistor M9 can be connected to the first bias potential bias1. One channel terminal of the tenth transistor M10 can be connected to another channel terminal of the ninth transistor M9, another channel terminal of the tenth transistor M10 can be connected to the reference node NREF, and the control terminal of the tenth transistor M10 can be connected to the reference potential. The ninth transistor M9 corresponds to the combination of the transistors M1 and M2 in the first current source 210, and the tenth transistor M10 corresponds to the switch K1 (that is, the transistor M13 in FIG. 5) in the first current source 210. When the first transistor M1 and the second transistor M2 are PMOSs, the ninth transistor M9, the tenth transistor M10, and the transistor M13 all can be PMOSs.

Similarly, the second mirror current source 240 can include the eleventh transistor M11 and the twelfth transistor M12. One channel terminal of the eleventh transistor M11 can be connected to the reference potential, and the control terminal of the eleventh transistor M11 can be connected to the second bias potential bias2. One channel terminal of the twelfth transistor M12 can be connected to another channel terminal of the eleventh transistor M11, another channel terminal of the twelfth transistor M12 can be connected to the reference node NREF, and the control terminal of the twelfth transistor M12 can be connected to the power supply potential VDD. The eleventh transistor M11 corresponds to the combination of the transistors M3 and M4 in the second current source 220, and the twelfth transistor M12 corresponds to the switch K2 (that is, the transistor M14 in FIG. 5) in the second current source 220. When the third transistor M3 and the fourth transistor M4 are NMOSs, the eleventh transistor M11, the twelfth transistor M12, and the transistor M14 all can be NMOSs.

In the specific embodiment of FIG. 5, the operational amplifier follower 250 can include the operational amplifier whose first input terminal can be connected to the reference node NREF, the second input terminal can be connected to the output node NOUT, and the output terminal of the operational amplifier follower 250 is connected to the first bias potential bias1.

In the charge pump shown in FIG. 5, when the loop bandwidth changes, the third ratio m (the current mirror multiple) between the first current I1 of the first current source 210 and the third current I3 of the first mirror current source 230 remains unchanged, the fourth ratio m between the second current I2 of the second current source 220 and the fourth current I4 of the second mirror current source 240 remains unchanged, and the third current I3 is equal to the fourth current I4, thus the first current I1 and the second current I2 can be remained equal. That is, the charging current and the discharging current of the charge pump match to each other, thereby avoiding the re-locking of the phase-locked loop circuit.

Figure 6:
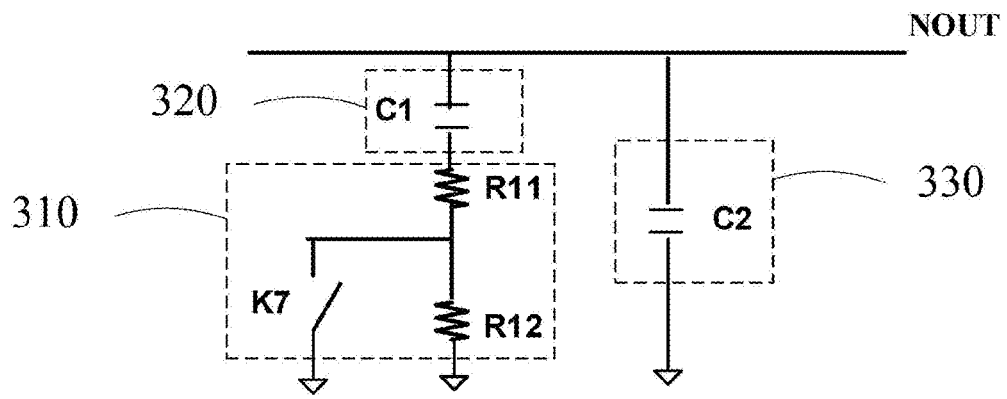
FIG. 6 shows a schematic circuit diagram of a loop filter in a phase-locked loop circuit according to an exemplary embodiment of the present disclosure.
Figure 7:
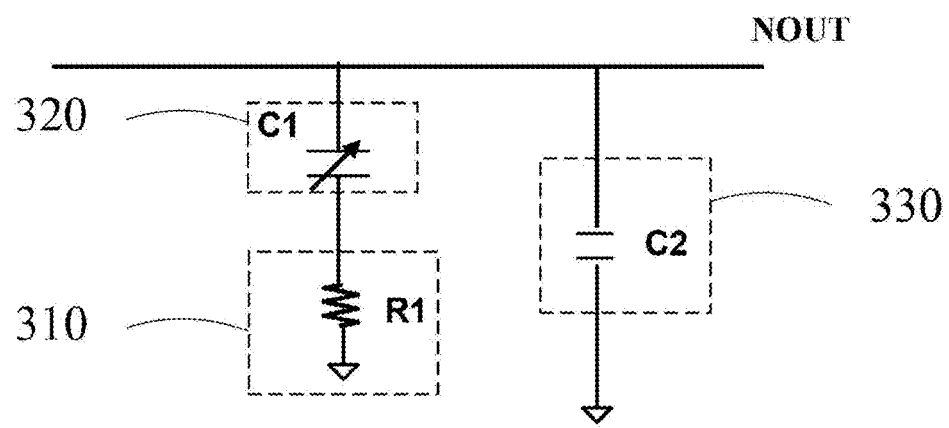
FIG. 7 shows a schematic circuit diagram of a loop filter in a phase-locked loop circuit according to another exemplary embodiment of the present disclosure.
Figure 8:
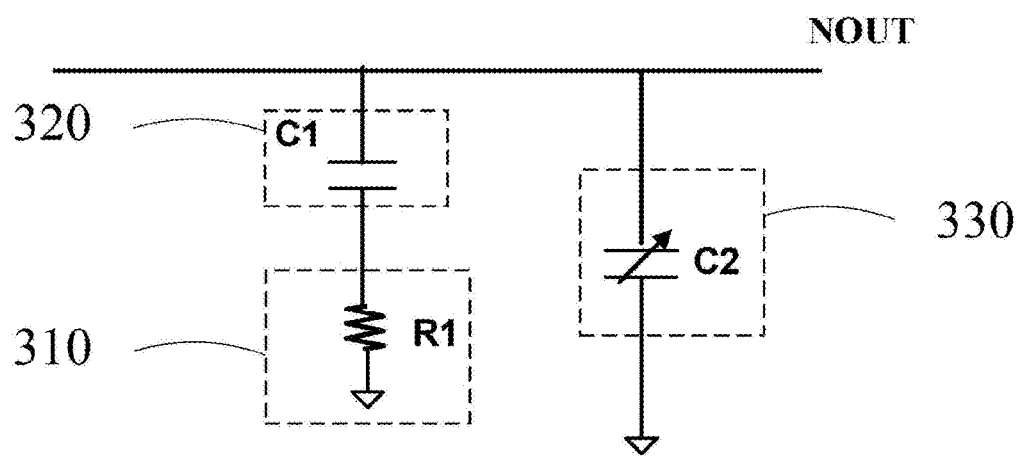
FIG. 8 shows a schematic circuit diagram of a loop filter in a phase-locked loop circuit according to still another exemplary embodiment of the present disclosure.

In order to adjust the first resistance value R1, the first capacitance value C1, or the first capacitance value C2 in the loop filter 300 as required, the loop filter 300 in which each of the above values is continuously adjustable or discretely adjustable can be employed. FIGS. 6 to 8 show some specific examples of the loop filter 300. It can be understood that other loop filters 300 can also be used to achieve adjustment of the relevant physical quantities, which is not described redundantly herein.

The loop filter 300 shown in FIGS. 6 to 8 can include the first resistive component 310, the first capacitive component 320, and the second capacitive component 330. The first resistive component 310 can have the first resistance value R1, the first capacitive component 320 can have the first capacitance value C1, and the first capacitive component 320 and the first resistive component 310 can be connected in series between the output node NOUT and the reference potential. It should be noted that the positions of the first resistive component 310 and the first capacitive component 320 are interchangeable. Moreover, the second capacitive component 330 can have the second capacitance value C2, and the second capacitive component 330 can be connected between the output node NOUT and the reference potential.

FIG. 6, is a circuit diagram of a loop filter 300 that can be switched between two first resistance values. The first resistive component 310 can include the first resistor with the resistance value R11, the second resistor with the resistance value R12, and the seventh switch K7. The second resistor and the first resistor can be connected in series between two ends of the first resistive component 310. The seventh switch K7 can be connected between either end of the first resistive component 310 and the connection node between the first resistor and the second resistor. In the specific embodiment shown in FIG. 6, the first resistance value is R11 when the seventh switch K7 is turned on, whereas the first resistance value is (R11+R12) when the seventh switch K7 is turned off, achieving the switching between the two first resistance values.

The resistance value R11 of the first resistor and the resistance value R12 of the second resistor are determined according to at least change of the first resistance value before and after adjustment. For example, when the loop filter 300 in FIG. 6 is used with the charge pump 200 in FIG. 3 or 5, and the ratio of the adjusted current value to the unadjusted current is K, R11 and R12 can satisfy R12=($\sqrt{K}$−1)R11, and on and off states of the seventh switch K7 can be the same as that of the fourth switch K4.

When the phase-locked loop circuit 300 in FIG. 6 is used with the charge pump 200 in FIG. 3 or FIG. 5, the loop bandwidth can be changed by adjusting only the charge pump current and the first resistance value while maintaining the phase margin unchanged. Adjusting only the charge pump current and the first resistance value can well simplify the structure of the phase-locked loop circuit and avoid other changes that may be brought by complex adjustment.

FIG. 7 shows a loop filter 300 with an adjustable first capacitance value. The first capacitive component 320 can include the first adjustable capacitor.

Similarly, FIG. 8 shows a loop filter 300 with an adjustable second capacitance value. The second capacitive component 330 of the loop filter 300 can include the second adjustable capacitor.

In the present disclosure, the loop bandwidth is switched by changing at least two of the charge pump current Icp, the first resistance value R1, the first capacitance value C1, and the second capacitance value C2 in the phase-locked loop circuit while maintaining the ratio between the zero frequency/pole frequency of the loop and the loop bandwidth unchanged, to maintain the phase margin of the loop unchanged, thereby ensuring the loop stability. In addition, in the present disclosure, the structure of the charge pump is further improved to eliminate the mismatching between the charging current and the discharging current of the charge pump, so that the phase-locked loop circuit is prevented from the phase error at the moment of bandwidth switching and thus does not require re-locking. The present disclosure solves the problem that may be caused by the change of the loop bandwidth, which realizes the fast locking of the phase-locked loop circuit while ensuring the noise performance of the phase-locked loop circuit by increasing the loop bandwidth during initial locking and switching to the narrow loop bandwidth after the locking.

The present disclosure further provides a signal processing device including the phase-locked loop circuit as described above. The signal processing device can specifically include the mobile communication base station, the frequency modulation communication system, and the like.

Moreover, implementations of the present disclosure can further include the following examples.

1. A phase-locked loop circuit, comprising:
   a charge pump configured with a charge pump current; and
   a loop filter connected to the charge pump and configured with a first resistance value, a first capacitance value, and a second capacitance value, wherein a zero frequency of the phase-locked loop circuit is configured to be determined by the first resistance value and the first capacitance value, and a pole frequency of the phase-locked loop circuit is configured to be determined by the first resistance value and the second capacitance value;
   wherein at least two of the charge pump current, the first resistance value, the first capacitance value, and the second capacitance value are adjustable, to change a loop bandwidth of the phase-locked loop circuit, to maintain a first ratio between the zero frequency and the loop bandwidth unchanged, and to maintain a second ratio between the pole frequency and the loop bandwidth unchanged.

2. The phase-locked loop circuit according to 1, when an adjusted charge pump current is K times as much as an unadjusted charge pump current, an adjusted first resistance value is $1/\sqrt{K}$ times as much as an unadjusted first resistance value, and the first capacitance value and the second capacitance value remain unchanged before and after adjustment.

3. The phase-locked loop circuit according to 1, when an adjusted charge pump current is K times as much as an unadjusted charge pump current, an adjusted first capacitance value is $1/K$ times as much as an unadjusted first capacitance value, an adjusted second capacitance value is $1/K$ times as much as an unadjusted second capacitance value, and the first resistance value remains unchanged before and after adjustment.

4. The phase-locked loop circuit according to 1, wherein when an adjusted first resistance value is $1/\sqrt{K}$ times as much as an unadjusted first resistance value, an adjusted first capacitance value is K times as much as an unadjusted first capacitance value, an adjusted second capacitance value is K times as much as an unadjusted second capacitance value, and the charge pump current remains unchanged before and after adjustment.

5. The phase-locked loop circuit according to 1, the charge pump comprises:
   a first current source, a first node of the first current source is configured to be connected to a power supply potential, and a second node of the first current source is connected to an output node of the charge pump via a first switch, wherein the charge pump current comprises a first current of the first current source; and
   a second current source, a third node of the second current source is connected to the output node via a second switch, and a fourth node of the second current source is configured to be connected to a reference potential, wherein the charge pump current comprises a second current of the second current source.

6. The phase-locked loop circuit according to 5, the first current source comprises:
   a first transistor, one channel terminal of the first transistor is connected to the first node, another channel terminal of the first transistor is connected to the second node, and a control terminal of the first transistor is configured to be connected to a first bias potential; and
   a second transistor, one channel terminal of the second transistor is connected to the first node, another channel terminal of the second transistor is connected to the second node, and a control terminal of the second transistor is configured to be connected to the power supply potential via a third switch and to the first bias potential via a fourth switch respectively; and
   the second current source comprises:
   a third transistor, one channel terminal of the third transistor is connected to the third node, another channel terminal of the third transistor is connected to the fourth node, and a control terminal of the third transistor is configured to be connected to a second bias potential; and
   a fourth transistor, one channel terminal of the fourth transistor is connected to the third node, another channel terminal of the fourth transistor is connected to the fourth node, and a control terminal of the fourth transistor is configured to be connected to the second bias potential via a fifth switch and to the reference potential via a sixth switch respectively.

7. The phase-locked loop circuit according to 6, on and off states of the third switch are configured to be opposite to that of the fourth switch, on and off states of the fifth switch are configured to be opposite to that of the sixth switch, and on and off states of the third switch are configured to be same as that of the sixth switch.

8. The phase-locked loop circuit according to 7, the third switch and the sixth switch are respectively a fifth transistor and an eighth transistor configured to be controlled by a first switch signal; and
   the fourth switch and the fifth switch are respectively a sixth transistor and a seventh transistor configured to be controlled by a second switch signal;
   wherein the first switch signal and the second switch signal are opposite in phase.

9. The phase-locked loop circuit according to 6, a channel doping type of the first transistor is same as that of the second transistor, a channel doping type of the third transistor is same as that of the fourth transistor, and the channel doping type of the first transistor is opposite to that of the third transistor.

10. The phase-locked loop circuit according to 6, a channel width of the first transistor and a channel width of the second transistor are determined according to at least a change of the charge pump current before and after adjustment; and
    a channel width of the third transistor and a channel width of the fourth transistor are determined according to at least the change of the charge pump current before and after the adjustment.

11. The phase-locked loop circuit according to 5, the charge pump further comprises:
    a first mirror current source forming a first current mirror with the first current source;

a second mirror current source forming a second current mirror with the second current source and connected with the first mirror current source at a reference node; and an operational amplifier follower connected between the reference node and the output node;

wherein a third ratio between the first current of the first current source and a third current of the first mirror current source remains unchanged, a fourth ratio between the second current of the second current source and a fourth current of the second mirror current source remains unchanged, and the third current is equal to the fourth current.

12. The phase-locked loop circuit according to 11, the first mirror current source comprises:

a ninth transistor, one channel terminal of the ninth transistor is configured to be connected to the power supply potential, and a control terminal of the ninth transistor is configured to be connected to a first bias potential; and a tenth transistor, one channel terminal of the tenth transistor is connected to another channel terminal of the ninth transistor, another channel terminal of the tenth transistor is connected to the reference node, and a control terminal of the tenth transistor is configured to be connected to the reference potential; and the second mirror current source comprises:

an eleventh transistor, one channel terminal of the eleventh transistor is configured to be connected to the reference potential, and a control terminal of the eleventh transistor is configured to be connected to a second bias potential, and a twelfth transistor, one channel terminal of the twelfth transistor is connected to another channel terminal of the eleventh transistor, another channel terminal of the twelfth transistor is connected to the reference node, and a control terminal of the twelfth transistor is configured to be connected to the power supply potential.

13. The phase-locked loop circuit according to 11, a first input terminal of the operational amplifier follower is connected to the reference node, a second input terminal of the operational amplifier follower is connected to the output node, and an output terminal of the operational amplifier follower is connected to a first bias potential.

14. The phase-locked loop circuit according to 1, the loop filter comprises:

a first resistive component with a first resistance value;

a first capacitive component with a first capacitance value, and the first capacitive component and the first resistive component are configured to be connected in series between the output node and the reference potential; and a second capacitive component with a second capacitance value, and the second capacitive component is configured to be connected between the output node and the reference potential.

15. The phase-locked loop circuit according to 14, the first resistive component comprises:

a first resistor;

a second resistor connected in series with the first resistor between two ends of the first resistive component; and a seventh switch connected between one terminal of the first resistive component and a connection node between the first resistor and the second resistor.

16. The phase-locked loop circuit according to 15, a resistance value of the first resistor and a resistance value of the second resistor are determined according to at least a change of the first resistance value before and after adjustment.

17. The phase-locked loop circuit according to 14, the first capacitive component comprises a first adjustable capacitor.

18. The phase-locked loop circuit according to 14, the second capacitive component comprises a second adjustable capacitor.

19. The phase-locked loop circuit according to 1, a loop bandwidth of the phase-locked loop circuit during locking is larger than that of the phase-locked loop circuit in a locked state.

20. A signal processing device, comprising the phase-locked loop circuit according to any one of 1 to 19.

In all examples shown and discussed herein, any specific value should be interpreted only as an example but not a limitation. Therefore, other examples of the exemplary embodiments can have different values.

The terms "front", "rear", "top", "bottom", "above", "below" and the like in the description and in the claims, if any, are used for descriptive purposes and not necessarily for describing constant relative positions. It is to be understood that the terms used in such a way are interchangeable in proper circumstances so that embodiments of the present disclosure described herein can, for example, operate in other orientations different from those shown herein or otherwise described.

As used herein, a term "exemplary" means "used as an example, instance, or illustration", and is not intended to be a "model" to be accurately copied. Any implementation illustratively described herein is not necessarily to be construed as preferred or advantageous over other implementations. Moreover, the present disclosure is not limited by any expressed or implied principle given in the above technical field, background, summary, or detailed description.

As used herein, a term "substantially" is intended to encompass any minor variation caused by at least one of design or manufacturing defect, device or component tolerance, environmental influences, and other factors. The term "substantially" also allows for differences from a perfect or ideal situation due to parasitic effects, noise, and other practical considerations that may exist in a practical implementation.

The above description may indicate elements or nodes or features that are "connected" or "coupled" together. As used herein, unless expressly stated otherwise, "connected" means that one element/node/feature is directly connected (or directly communication) to another element/node/feature electrically, mechanically, logically, or in other manners. Similarly, unless expressly stated otherwise, "coupled" means that one element/node/feature may be directly or indirectly linked with another element/node/feature mechanically, electrically, logically or in other manners, to allow an interaction, even though the two features may not be directly connected. That is, "coupled" is intended to include direct or indirect connections between elements or other features, including couplings using one or more intermediate elements.

It is further to be understood that the term "comprise/include", when used herein, specifies the presence of at least one of stated features, integers, steps, operations, elements, and components, but does not preclude the presence or addition of at least one of one or more other features, integers, steps, operations, elements, and components, and/or combinations thereof.

One skilled in the art should recognize that the boundaries between the above operations is merely illustrative. A plurality of operations may be combined into a single operation, and a single operation may be distributed in an additional operation, and the operations may be performed at least partially overlapping in time. Moreover, alternative embodiments may include a plurality of examples of particular operations, and the operation sequence may be changed in other various embodiments. Other modifications, changes, and replacements, however, may also exist. Therefore, the description and drawings are to be regarded as illustrative rather than limited.

Despite the detailed illustration of some particular embodiments of the present disclosure by the examples, one skilled in the art should understand that the above examples are merely intended to describe rather than to limit the scope of the present disclosure. One skilled in the art should further understand that various changes may be made to the embodiments without departing from the scope and spirit of the present disclosure. The scope of the present disclosure is defined by the appended claims.

What is claimed is:

1. A phase-locked loop circuit, comprising:
    a charge pump configured with a charge pump current; and
    a loop filter connected to the charge pump and configured with a first resistance value, a first capacitance value, and a second capacitance value, wherein a zero frequency of the phase-locked loop circuit is configured to be determined by the first resistance value and the first capacitance value, and a pole frequency of the phase-locked loop circuit is configured to be determined by the first resistance value and the second capacitance value;
    wherein at least two of the charge pump current, the first resistance value, the first capacitance value, and the second capacitance value are adjustable to change a loop bandwidth of the phase-locked loop circuit, to maintain a first ratio between the zero frequency and the loop bandwidth unchanged, and to maintain a second ratio between the pole frequency and the loop bandwidth unchanged comply with a following relationship:
    when an adjusted charge pump current is K times as much as an unadjusted charge pump current, an adjusted first capacitance value is 1/K times as much as an unadjusted first capacitance value, an adjusted second capacitance value is 1/K times as much as an unadjusted second capacitance value, and the first resistance value remains unchanged before and after adjustment, or
    when an adjusted first resistance value is $1/\sqrt{K}$ times as much as an unadjusted first resistance value, an adjusted first capacitance value is K times as much as an unadjusted first capacitance value, an adjusted second capacitance value is K times as much as an unadjusted second capacitance value, and the charge pump current remains unchanged before and after adjustment.

2. The phase-locked loop circuit according to claim 1, wherein the charge pump comprises:
    a first current source, a first node of the first current source is configured to be connected to a power supply potential, and a second node of the first current source is connected to an output node of the charge pump via a first switch, wherein the charge pump current comprises a first current of the first current source; and
    a second current source, a third node of the second current source is connected to the output node via a second switch, and a fourth node of the second current source is configured to be connected to a reference potential, wherein the charge pump current comprises a second current of the second current source.

3. The phase-locked loop circuit according to claim 2, wherein the first current source comprises:
    a first transistor, one channel terminal of the first transistor is connected to the first node, another channel terminal of the first transistor is connected to the second node, and a control terminal of the first transistor is configured to be connected to a first bias potential; and
    a second transistor, one channel terminal of the second transistor is connected to the first node, another channel terminal of the second transistor is connected to the second node, and a control terminal of the second transistor is configured to be connected to the power supply potential via a third switch and to the first bias potential via a fourth switch respectively; and
    the second current source comprises:
    a third transistor, one channel terminal of the third transistor is connected to the third node, another channel terminal of the third transistor is connected to the fourth node, and a control terminal of the third transistor is configured to be connected to a second bias potential; and
    a fourth transistor, one channel terminal of the fourth transistor is connected to the third node, another channel terminal of the fourth transistor is connected to the fourth node, and a control terminal of the fourth transistor is configured to be connected to the second bias potential via a fifth switch and to the reference potential via a sixth switch respectively.

4. The phase-locked loop circuit according to claim 3, wherein on and off states of the third switch are configured to be opposite to that of the fourth switch, on and off states of the fifth switch are configured to be opposite to that of the sixth switch, and on and off states of the third switch are configured to be same as that of the sixth switch.

5. The phase-locked loop circuit according to claim 4, wherein the third switch and the sixth switch are respectively a fifth transistor and an eighth transistor configured to be controlled by a first switch signal; and
    the fourth switch and the fifth switch are respectively a sixth transistor and a seventh transistor configured to be controlled by a second switch signal;
    wherein the first switch signal and the second switch signal are opposite in phase.

6. The phase-locked loop circuit according to claim 3, wherein a channel doping type of the first transistor is same as that of the second transistor, a channel doping type of the third transistor is same as that of the fourth transistor, and the channel doping type of the first transistor is opposite to that of the third transistor.

7. The phase-locked loop circuit according to claim 3, wherein a channel width of the first transistor and a channel width of the second transistor are determined according to at least a change of the charge pump current before and after adjustment; and
    a channel width of the third transistor and a channel width of the fourth transistor are determined according to at least the change of the charge pump current before and after the adjustment.

8. The phase-locked loop circuit according to claim 2, wherein the charge pump further comprises:

a first mirror current source forming a first current mirror with the first current source;

a second mirror current source forming a second current mirror with the second current source and connected with the first mirror current source at a reference node; and an operational amplifier follower connected between the reference node and the output node;

wherein a third ratio between the first current of the first current source and a third current of the first mirror current source remains unchanged, a fourth ratio between the second current of the second current source and a fourth current of the second mirror current source remains unchanged, and the third current is equal to the fourth current.

9. The phase-locked loop circuit according to claim 8, wherein the first mirror current source comprises:

a ninth transistor, one channel terminal of the ninth transistor is configured to be connected to the power supply potential, and a control terminal of the ninth transistor is configured to be connected to a first bias potential; and a tenth transistor, one channel terminal of the tenth transistor is connected to another channel terminal of the ninth transistor, another channel terminal of the tenth transistor is connected to the reference node, and a control terminal of the tenth transistor is configured to be connected to the reference potential; and the second mirror current source comprises:

an eleventh transistor, one channel terminal of the eleventh transistor is configured to be connected to the reference potential, and a control terminal of the eleventh transistor is configured to be connected to a second bias potential, and a twelfth transistor, one channel terminal of the twelfth transistor is connected to another channel terminal of the eleventh transistor, another channel terminal of the twelfth transistor is connected to the reference node, and a control terminal of the twelfth transistor is configured to be connected to the power supply potential.

10. The phase-locked loop circuit according to claim 8, wherein a first input terminal of the operational amplifier follower is connected to the reference node, a second input terminal of the operational amplifier follower is connected to the output node, and an output terminal of the operational amplifier follower is connected to a first bias potential.

11. The phase-locked loop circuit according to claim 1, wherein the loop filter comprises:

a first resistive component with the first resistance value;

a first capacitive component with the first capacitance value, and the first capacitive component and the first resistive component are configured to be connected in series between the output node and the reference potential; and a second capacitive component with the second capacitance value, and the second capacitive component is configured to be connected between the output node and the reference potential.

12. The phase-locked loop circuit according to claim 11, wherein the first resistive component comprises:

a first resistor;

a second resistor connected in series with the first resistor between two ends of the first resistive component; and a seventh switch connected between one terminal of the first resistive component and a connection node between the first resistor and the second resistor.

13. The phase-locked loop circuit according to claim 12, wherein a resistance value of the first resistor and a resistance value of the second resistor are determined according to at least a change of the first resistance value before and after adjustment.

14. The phase-locked loop circuit according to claim 11, wherein the first capacitive component comprises a first adjustable capacitor.

15. The phase-locked loop circuit according to claim 11, wherein the second capacitive component comprises a second adjustable capacitor.

16. The phase-locked loop circuit according to claim 1, wherein a loop bandwidth of the phase-locked loop circuit during locking is larger than that of the phase-locked loop circuit in a locked state.

17. A signal processing device, comprising the phase-locked loop circuit according to claim 1.

* * * * *